(12) United States Patent
Singh

(10) Patent No.: US 6,373,553 B1
(45) Date of Patent: Apr. 16, 2002

(54) PHOTO-LITHOGRAPHIC METHOD TO PRINT A LINE-SPACE PATTERN WITH A PITCH EQUAL TO HALF THE PITCH OF THE MASK

(75) Inventor: Vivek K. Singh, Portland, OR (US)

(73) Assignee: Intel Corp., Santa Clara, CA (US)

( * ) Notice: Subject to any disclaimer, the term of this patent is extended or adjusted under 35 U.S.C. 154(b) by 0 days.

(21) Appl. No.: 09/398,779

(22) Filed: Sep. 20, 1999

(51) Int. Cl.[7] .............. G03B 27/52; G03B 27/42; G03B 27/32; G03C 5/00
(52) U.S. Cl. .............. 355/55; 355/53; 355/77; 430/311
(58) Field of Search .............. 355/53, 55, 67, 355/77; 356/399–401; 430/311

(56) References Cited

U.S. PATENT DOCUMENTS

| 4,828,392 A | * | 5/1989 | Nomura et al. .............. 356/401 |
| 4,972,075 A | * | 11/1990 | Hamada et al. .......... 250/201.5 |
| 5,703,675 A | * | 12/1997 | Hirukawa et al. ............. 355/53 |

\* cited by examiner

*Primary Examiner*—Russell Adams
*Assistant Examiner*—Hung Henry Nguyen
(74) *Attorney, Agent, or Firm*—Antonelli, Terry, Stout & Kraus, LLP

(57) ABSTRACT

An optical lithography system and method which utilizes a mask pattern and forms Talbot sub-images of an illuminated grating onto a photosensitive target to print an image pattern on the photosensitive target such that the image pattern printed has a pitch equal to half the pitch of the mask pattern.

32 Claims, 6 Drawing Sheets

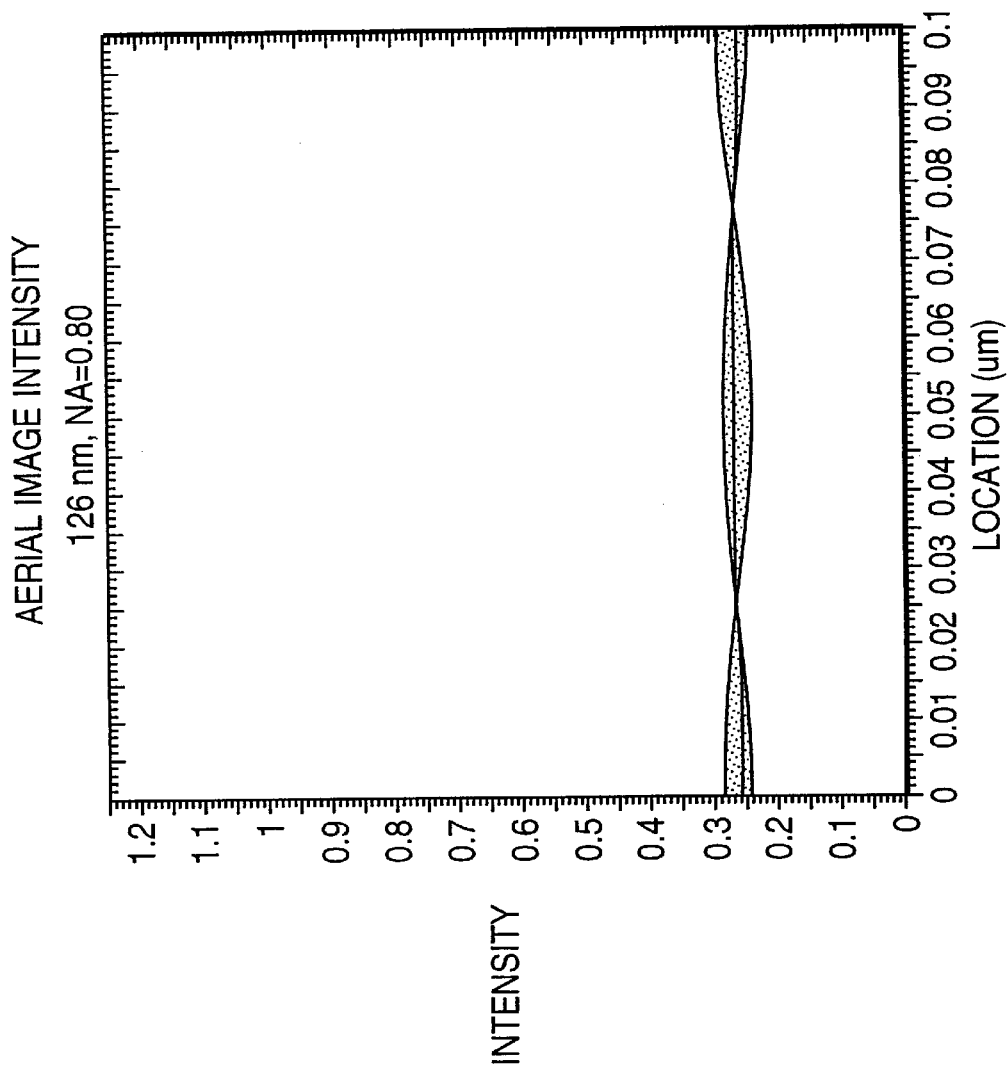

PHOTO-LITHOGRAPHIC METHOD TO PRINT A LINE-SPACE PATTERN WITH A PITCH EQUAL TO HALF THE PITCH OF THE MASK

TECHNICAL FIELD

The present invention relates to optical lithography, and more particularly, relates to a photo-lithography technique that utilizes Talbot sub-images of an illuminated grating to print a line-space pattern in photosensitive media such that the printed pattern has a pitch that is smaller than the mask pitch.

BACKGROUND

Lithography refers to a family of techniques for transferring an image rendered on one form of media onto that of another media, typically by photographically "printing" the image. Photolithography techniques are widely used in semiconductor manufacture and other applications such as large or ultra-large scale integration semiconductor microcircuits (chips). Silicon substrates upon which these circuits are to be created are coated with a radiation (i.e., light) sensitive material chosen for its ability to accurately replicate the desired image, exposed to a source of radiation partially blocked by a mask having the required pitch to render a pattern. Typically, the circuit pattern is rendered as a positive or negative mask image which is then "projected" onto the coated substrate, in either a transmission or reflection mode, depending on the type of optical lithography system being used. The mask is thus imaged on the surface of the coated substrate where the incoming radiation chemically changes those areas of the coating (e.g., photosensitive layer) on which the process radiation impinges, usually by polymerizing the coating exposed to the radiation. Depending on the developer (solvent) used the unpolymerized areas are removed, being more soluble in the developer than the polymerized regions, and the desired pattern image remains.

Since this process allows chip manufacturers to effectively replicate the mask image indefinitely with little additional expense, "projection" photolithography has become an essential and powerful tool for manufacturing semiconductor "chips." However, as the drive to place ever greater numbers for components on those chips continues, the need to resolve ever smaller image features also continues. In doing so, the diffraction limits of visible light wavelengths have been reached. In order to continue "printing" these features with high resolution and contrast, using shorter wavelength radiation is necessary. Typical optical lithography systems use radiation at wavelengths such as 365 nm, 248 nm, 193 nm, 157 nm and 126 nm. Currently, only 193 nm steppers are commercially available for volume manufacturing, however. Steppers using 157 nm and 126 nm wavelengths are still in the development phase. Advanced non-optical lithography systems with shorter wavelengths such as "extreme" ultraviolet or soft x-ray are now being actively researched for printing complex patterns in the extreme submicron range. However, the problem of diffraction limited optics remains, and the drive to using shorter wavelengths provide only limited results.

In addition to shorter wavelength radiation, there are several techniques available for high resolution and contrast optical lithography. One technique developed by chip manufacturers to increase the resolution and contrast of optical lithography involves the use of phase-shifting masks. Light rays transmitted through adjacent apertures of the mask follow different phases. However, phase-shifting masks are costly and difficult to manufacture because the phase structure must be closely related to specific geometries of the mask pattern. Moreover, as microcircuit pitches shrinks in size, mask making techniques do not necessarily keep pace.

Another technique developed by chip manufacturers is referred as "engineered illumination" to help print smaller and smaller features of semiconductor microcircuits. This technique relies upon the use of various "patterns" of illumination including annular and quadrapole illumination, and off-axis illumination. However, these methods result in reduced condenser efficiency or require that the illuminator be seriously modified. All of these methods and assist features are time consuming, expensive, and less efficient. Advanced non-optical lithography systems such as "extreme" ultraviolet (EUV) lithography and e-beam (SCALPEL) lithography are being developed; however, they are cost-prohibitive.

Accordingly, there is a need for a simple yet effective method for existing optical lithography systems to print patterns in the submicron range such as nested (or periodic) line-space patterns in the metal and shallow trench regions (STR) with better feasibility and manufacturing tolerance.

SUMMARY

Accordingly, various embodiments of the present invention are directed to an optical lithography system and method which utilizes a mask pattern and forms Talbot sub-images of an illuminated grating onto a photosensitive target to print an image pattern on the photosensitive target such that the image pattern printed has a pitch equal to half the pitch of the mask pattern.

BRIEF DESCRIPTION OF THE DRAWINGS

A more complete appreciation of exemplary embodiments of the present invention, and many of the attendant advantages of the present invention, will become readily apparent as the same becomes better understood by reference to the following detailed description when considered in conjunction with the accompanying drawings in which like reference symbols indicate the same or similar components, wherein:

FIG. 3 illustrates the light intensity distribution obtained with 126 nm radiation at different locations of the desired pattern shown in FIG. 2;

DETAILED DESCRIPTION

The present invention is applicable for use with all types of existing optical lithography systems, light sources, and pattern masks, including those lithography systems with advanced resolution enhancement techniques. Further, the present invention is not limited to use in semiconductor manufacture, but is suitable for applications in many industries and/or environments. However, for the sake of simplicity, discussions will concentrate mainly on exemplary use of line-space patterns with critical dimensions and pitch sizes that are not easily replicated using existing optical lithography systems using 157 nm or 126 nm lithography, although the scope of the present invention is not limited thereto.

Figure 1:
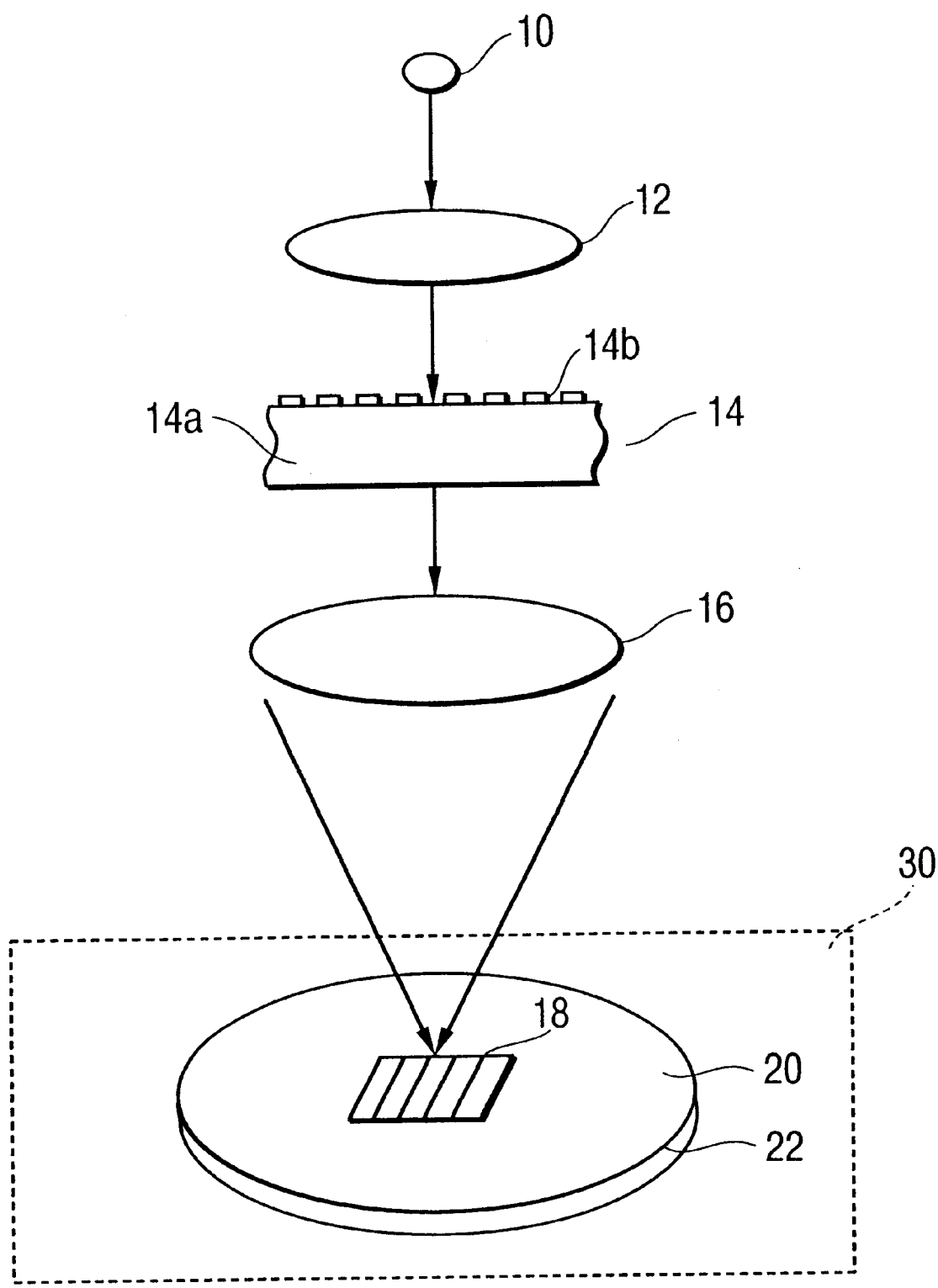
FIG. 1 is a schematic diagram of the general optical arrangement of an optical lithography system for printing a desired image pattern in the submicron range according to the principles of the present invention.

Attention now is directed to the drawings and particularly to FIG. 1, where a general optical arrangement of an existing optical lithography system developed for printing a desired pattern image in the submicron range according to the principles of the present invention is illustrated. As shown in FIG. 1, the optical lithography system may include a light source 10, beam forming optics 12, an optical mask 14, a projection lens 16 for illuminating a pattern mask onto a semiconductor substrate (referred herein as "wafer") 20 to form a desired pattern image 18 thereon.

The light source 10 may be a laser or an array of individual lasers or the like used for generating an ultraviolet light having a wavelength from 365 nm, 248 nm, 193 nm, 157 nm to 126 nm in general, and at 157 nm and 126 nm in particular. Examples of the types of lasers used may include ArF lasers, KrF lasers, and Fluorine lasers.

The beam forming optics 12 may be a single beam forming optic, or alternatively, an assembly of several lenses, including a collimator, a condenser, a reflection mirror, and a field lens for collecting a light beam from the light source 10 onto the optical mask 14.

The optical mask 14 may be a conventional transmission mask or a phase-shifting mask. Such an optical mask 14 may comprise a transparent substrate 14a and a mask pattern 14b having distributed opaque features with apertures therebetween for allowing light to pass there-through to form a desired pattern image 18 onto the wafer 20. The transparent substrate 14a may include material having suitable optical and mechanical properties for lithographic processes. Suitable materials may include quartz and silica based glass. The mask pattern 14b may comprise a highly opaque material such as chrome, chromium, and chromium oxides deposited on either side (top or bottom surface) of the transparent substrate 14a. Optionally, a phase structure (not shown in FIG. 1) may also be formed on the back side of the transparent substrate 14a opposite of the mask pattern 14b. The phase structure features may be defined by a pattern of grating lines and the grating parameters including, the grating frequency, the shape and phase distribution of the grating lines and orientations. These grating parameters are well-known in the art and therefore, need not be described in detail hereinbelow.

The wafer 20 may be photosensitive wafer, or alternatively, may include a photosensitive, or photo-resist layer 22 thereon for forming a desired pattern image 18 from light illumination via the optical mask 14. Such a wafer 20 may be positioned on a movable mechanism 30, arranged to be rotated and translated in two-dimensions respectively relative to the projection lens 16. Control devices, motors and linkages which control the rotational and translational motion of the wafer 20 are also well-known in the art and therefore, need not be described in detail.

Figure 2:
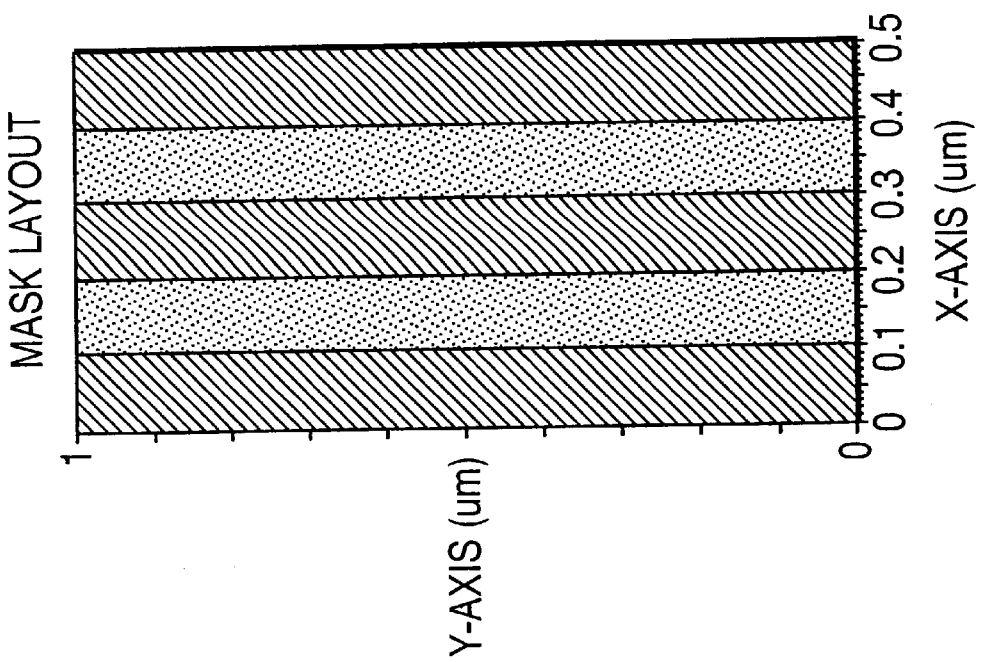
FIG. 2 illustrates a desired mask pattern with a 50 nm line in a 100 nm pitch.

As described with reference to FIG. 1, an existing optical lithography system may operate to print image mask patterns with critical dimensions (CD) in the submicron range. However, those image mask patterns are limited by the system radiation wavelengths. Many microcircuit patterns cannot be replicated since 157 nm or even 126 nm lithography may not able to provide sufficient focus, light distribution and resolution. For example, a nested (or periodic) line-space pattern with a 50 nm line in a 100 nm pitch as shown in FIG. 2 may not be obtained using existing 157 nm lithography or 126 nm lithography. Nevertheless, such a line-space pattern may be very useful, for example, for cell layouts and/or wiring structures. Consequently, if the image pattern of the mask as shown in FIG. 2 is desired using existing 157 nm or 126 nm lithography, focusing the light source 10 onto the photo-resist layer 22 of the wafer 20 may be impossible.

FIG. 3 shows the intensity of light obtained using 126 nm lithography from the beginning of a pitch to the end of the pitch of 100 nm is almost flat. If 157 nm lithography is used, the light intensity distribution is flat or, in other words, the light is distributed substantially equally across locations of the mask. Thus, the 157 nm lithography cannot focus the light and dark areas of the mask pattern as shown in FIG. 2 onto the photo-resist layer 22 of the wafer 20.

If 126 nm lithography is used, the image and contrast may only slightly better. As shown in FIG. 3, there is only slight improvement over the 157 nm lithography in that the sinusoidal plot shows that there is some difference in intensity with respect to the light and dark mask areas. However, the difference in intensity is still too small to be able to expose the photo-resist 22 to obtain the image pattern as shown in FIG. 2. Therefore the 126 nm lithography also fails to obtain the example image pattern as shown in FIG. 2.

While advanced non-optical lithography systems currently developed such as "extreme" ultraviolet (EUV) lithography and e-beam (SCALPEL) lithography with radiation wavelengths of less than 20 nm may be available, albeit extremely cost-prohibitive, to obtain the example image pattern as shown in FIG. 2, the present invention advantageously utilizes existing optical lithography systems such as, for example, 157 nm or 126 nm lithography and provides a simple yet effective method for those existing optical lithography systems to advance two generations ahead to print microcircuit patterns in the submicron range with better feasibility and manufacturing tolerance that were not previously printable using existing optical lithography systems. Examples of those patterns include nested (or periodic) line-space patterns in the metal and shallow trench regions (STR) with half the pitch and critical dimension (CD) of a mask pattern.

Figure 4:
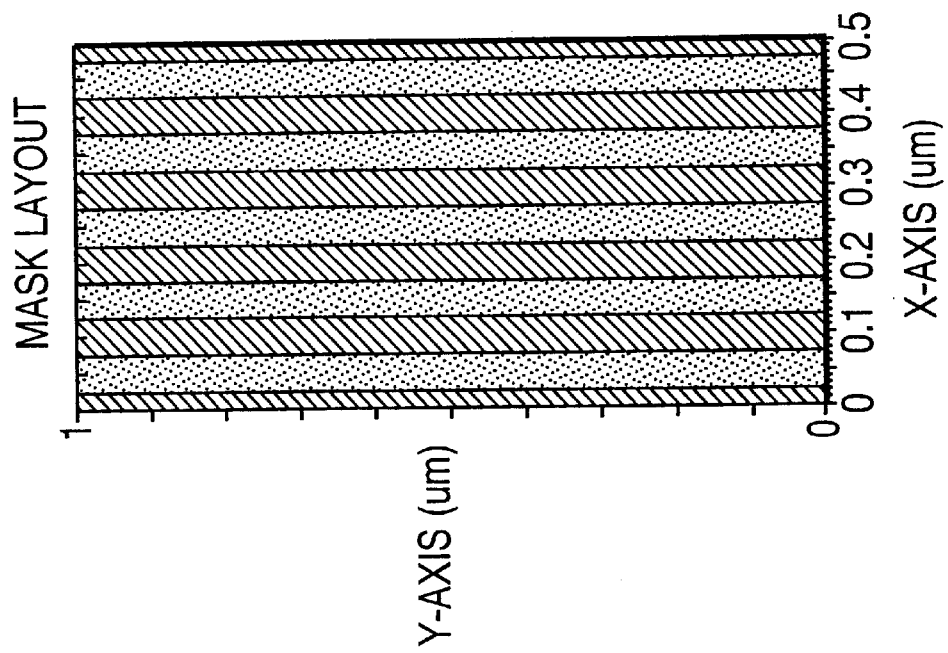
FIG. 4 illustrates a suggested mask pattern with a 100 nm line in a 200 nm pitch for use to print a desired mask pattern with a 50 nm line in a 100 nm pitch according to the principles of the present invention.

For example, if the image pattern of the mask with a 50 nm line in a 100 nm pitch as shown in FIG. 2 is desired, the present invention basically employs a larger mask pattern with double the pitch and the critical dimension (CD), i.e., a 100 nm line in a 200 nm pitch, as shown in FIG. 4, and utilizes Talbot sub-images of an illuminated grating for the existing optical lithography systems to effectively print, on the wafer 20, the image pattern as shown in FIG. 2. Talbot sub-images of an illuminated grating are advantageously utilized to print a line-space pattern on photosensitive media such that the printed pattern has a pitch equal to half the pitch of the mask. Consequently, if an image pattern with a 50 nm line in a 100 nm pitch of the FIG. 2 example is desired, then a mask with a 100 nm line in a 200 nm pitch may be utilized. Similarly, if an image pattern with a 60 nm line in a 120 nm pitch is desired, then a mask with a 120 nm line in a 240 nm pitch may be utilized. Likewise, if an image pattern with a 40 nm line in a 80 nm pitch is desired, then a mask with a 80 nm line in a 160 nm pitch may be utilized.

The so-called Talbot images refer to self-imaging properties of periodic structures. Typically an original image of an illuminated grating is formed at an image plane when a light source of wavelength $\lambda$ illuminates on the wafer 20 via the mask 14. If the image plane is moved (or the image is appropriately defocused) by a Talbot distance, Talbot sub-images are formed at an image plane each of which has half the pitch of the mask 14. The Talbot distance may be obtained through the use of a commercially available lithography simulator, or even through simple experimentation involving defocusing to various distances. In particular, the Talbot distance may also be determined by a grating equation of $L^2/2\lambda$, where L represents the pitch and $\lambda$ represents the wavelength of the light source for optical lithography at, for example, 365 nm, 248 nm, 193 nm, 157 nm to 126 nm in general, and at 157 nm and 126 nm in particular. Accordingly, if the pitch of the mask 14 is 200 nm and the 157 nm lithography is used, for example, the Talbot distance obtained from the grating equation of $L^2/2\lambda$ or $(200 \text{ nm})^2/2(157 \text{ nm})$ may be 127.28 nm or approximately 130 nm. Likewise, if the 126 nm lithography is used for the same pitch, then the Talbot distance obtained from the grating equation of $L^2/2\lambda$ or $(200 \text{ nm})^2/2(126 \text{ nm})$ may be 158.73 nm or approximately 160 nm. The contrast of the Talbot subimages provides sufficient depth of focus (DOF) that allows process latitude for semiconductor manufacture.

There may be several key elements to the optical lithography technique according to the principles of the present invention. First, the partial coherence of the light source 10 (or its spatial extent) has to be low. Secondly, image patterns at the tight pitches are intended. Patterns that are not the tight pitch may be protected by use of the standard two mask approach in the critical exposure, and printed by a second exposure using the usual mask. Finally, Talbot sub-images can be coupled with a photo-resist 22 that has the required imaging threshold and contrast to produce the desired image pattern 18 on the wafer 20. There may be several techniques/ sequences to optimize the resist performance for forming Talbot sub-images. For example, an anti-reflective coating with a refractive index matched to that of the photo-resist layer 22 may be used. A thin resist layer 22 may be deposited on the wafer 20. The threshold of the development process may be tuned so as to resolve Talbot sub-images in an ideal fashion. The photo-resist layer 22 may be optimized by post exposure bake (PEB) to reduce tilt of the resist lines. The minimum and maximum development rate of the photo-resist layer 22 may be optimized. If higher etch selectivity is needed, a subsequent dry-develop process may be used to translate Talbot sub-images into a thicker layer.

Figure 5:
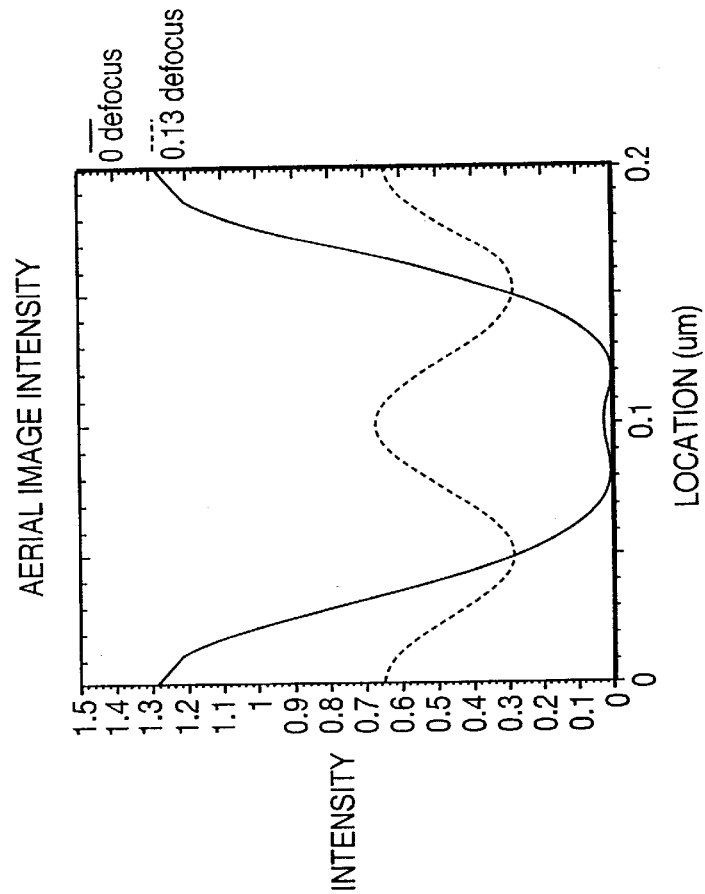
FIG. 5 illustrates an example of an aerial image intensity distribution of a desired mask pattern with a 100 nm line in 200 nm pitch on a wafer using 157 nm lithography, for a defocused image and a defocused Talbot sub-image.
Figure 6:
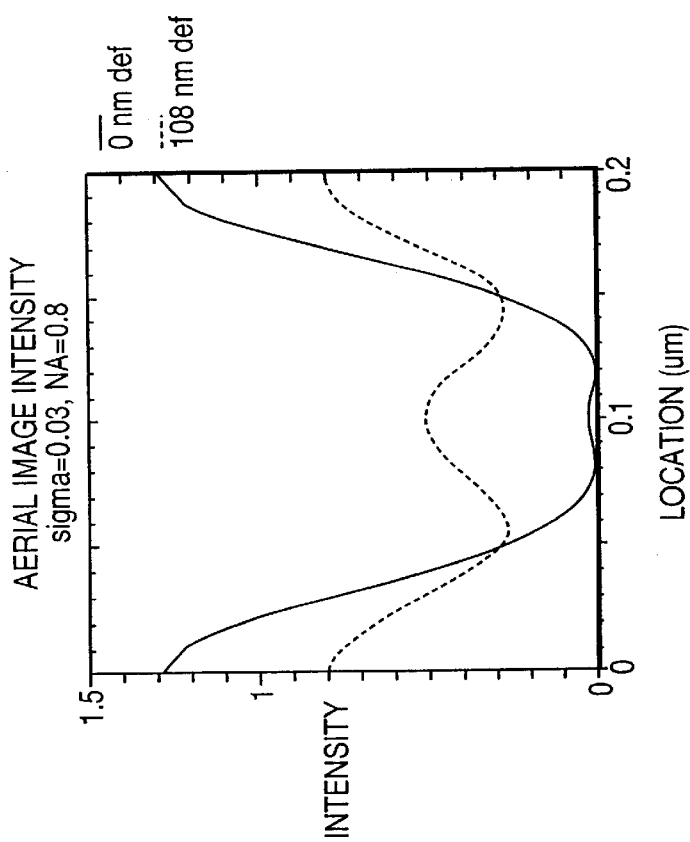
FIG. 6 illustrates an example of an aerial image intensity distribution of a desired mask pattern with a 100 nm line in 200 nm pitch using an existing 157 nm lithography for an original image and Talbot sub-images as an original image is defocused at a calculated defocus value.

Turning now to FIGS. 5 and 6, the formations of Talbot sub-images each of which has half the pitch of the mask according to the principles of the present invention are verified using, for example, existing 157 nm lithography. In particular, FIG. 5 illustrates an example of an aerial image intensity distribution of a desired mask pattern with a 100 nm line in 200 nm pitch as shown in FIG. 4 on a wafer 20 using existing 157 nm lithography for an original image and Talbot sub-images as an original image is defocused toward a calculated defocus value (Talbot distance obtained from the grating equation of $L^2/2\lambda$ according to an example of the present invention). As shown in FIG. 5, solid line indicates an original image represented by the light intensity distribution of the desired mask pattern from the beginning to the end of each pitch of 200 nm on a wafer 20 using an existing 157 nm lithography. A single line of 100 nm for each pitch of 200 nm of the desired mask pattern shown in FIG. 4 may be printed on the wafer 20 at the middle region of the pitch. In contrast to the solid line, dotted line indicates Talbot sub-images represented by the light intensity distribution of the same mask pattern from the beginning to the end of each pitch of 200 nm on the wafer 20 using the existing 157 nm lithography, when the original image is defocused (by moving the wafer 20 away from the image plane) by an example Talbot distance (or defocus value) of 108 nm. The example Talbot distance (or defocus value) may be set slightly away from the actual calculated Talbot distance of approximately 130 nm obtained from the grating equation of $L^2/2\lambda$ or $(200 \text{ nm})^2/2(157 \text{ nm})$ to illustrate the different levels of contrast of Talbot sub-images. Two lines each of which is 50 nm may be printed on the wafer 20 at the middle region of half the pitch.

FIG. 6 illustrates an example of an aerial image intensity distribution of a desired mask pattern with a 100 nm line in 200 nm pitch as shown in FIG. 4 on a wafer 20 using an existing 157 nm lithography for an original image and Talbot sub-images as an original image is defocused at a calculated defocus value of approximately 130 nm (Talbot distance obtained from the grating equation of $L^2/2\lambda$ according to the principles of the present invention). Solid line which indicates an original image represented by the light intensity distribution of the desired mask pattern remains the same as described with reference to FIG. 5. However, the dotted line which indicates Talbot sub-images represented by the light intensity distribution of the same mask pattern may now be equalized/optimized if the defocus is tweaked slightly to the calculated defocus value (Talbot distance) of approximately 130 nm obtained from the grating equation of $L^2/2\lambda$. A more accurate estimate of the optimal defocus distance may be obtained through the use of a commercially available lithography simulator, or even through simple experimentation involving defocusing to various distances.

The present invention basically employs a suggested mask pattern with double the pitch and critical dimension and utilizes Talbot sub-images to print an image pattern that has a pitch equal to half the pitch of the mask. The suggested mask pattern is the type of mask patterns that is printable using existing optical lithography systems. The printed pattern is the type of mask pattern that is not printable using existing optical lithography systems. However, by purposely defocusing the original image (by moving the wafer 20 away from the image plane by a Talbot distance), Talbot sub-images are formed on either side of the original image and each has a pitch that is equal to half the pitch of the mask. For example, if 157 nm lithography is applied to the mask pattern with a 100 nm line in a 200 nm pitch as shown in FIG. 4 with a slight defocus, each mask area may result in two Talbot sub-images at half size/pitch focused onto the mask. If such a mask is conventionally focused onto the photo-resist layer on the wafer 20, the light intensity distribution shown by the solid line in FIG. 5 may be obtained. A high degree of difference in light levels between the light and dark mask areas may be achieved, i.e., compare peaks verses valleys. However, only a 100 nm line in a 200 nm pitch may be achieved.

If such a mask is purposefully defocused by a Talbot distance (by tweaking the wafer 20 slightly away from the image plane), the Talbot light intensity distribution shown by the dotted line in FIG. 5 may be obtained. Note that there may be two smaller peaks obtained, thus resulting in the desired 50 nm line in 100 nm pitch.

There may be several problems with Talbot sub-images which must be resolved, however. First, note that the peaks achieved may not be the same height. Accordingly, if such light intensity distribution is used to expose a resist layer 22 on the wafer 20, lines of differing sizes may disadvantageously be achieved. If Talbot sub-images were achieved using an example defocus value shown in FIG. 5, image contrast may be corrected/equalized by tweaking the defocus to the calculated defocus value shown in FIG. 6, or vice verse. More particularly, the dotted line in FIG. 6 indicates that if defocus is tweaked to 130 nm, then the peaks may be equalized to enhance the image contrast.

A next problem may be that, although there is some level of difference in intensity between the peaks and valleys in FIG. 6 dotted line, the level of intensity difference may or may not be sufficient to expose a resist layer 22 on the wafer 20 to achieve the desired image pattern 18. As a result, additional techniques/sequences may advantageously be used to optimizing the resist performance and/or the desired image pattern 18.

For example, an anti-reflective coating (ARC) may be deposited below a resist layer on the wafer 20. More particularly, some light may travel through the resist layer and reflect off an underlying layer and bounce back upward. Such reflected light may disadvantageously set up a standing wave within the resist layer which interferes with the exposure (chemical change) of the resist layer. Consequently, if an ARC layer is deposited below the resist layer, the reflected light may be prevented, thus improving resist exposure.

Second, a thin resist formulation may be used to optimize the resist performance. In particular, a thin resist may be exposed faster/better with the light intensity distribution which is available.

Third, the threshold of the development process may be tuned so as to resolve image in an ideal fashion. For example, chip manufacturers may experiment with and tweak resist chemistry, developer chemistry/strength.

Fourth, the resist layer may be optimized during post exposure bake (PEB) to reduce tilt -of the resist lines. In particular, chip manufacturers may vary parameters such as temperature during post exposure bake (PEB) to vary the incline of the resist mask sides.

Fifth, the minimum and maximum development rate of the resist layer may be optimized. The use of a chemical liquid developer bath may be disadvantageous since the liquid developer may eat under a developed resist structure. In order to avoid such erosion, chip manufacturers may use development inside a plasma etch apparatus.

Further, a dual resist layer approach may be used to optimize the resist performance. The thin resist layer may first be exposed, and dry developed with plasma processing, then the exposed/developed thin resist layer may be further exposed/developed into a larger resist layer. The thicker resist layer may perform double duty as an ARC layer (discussed previously).

Figure 7:
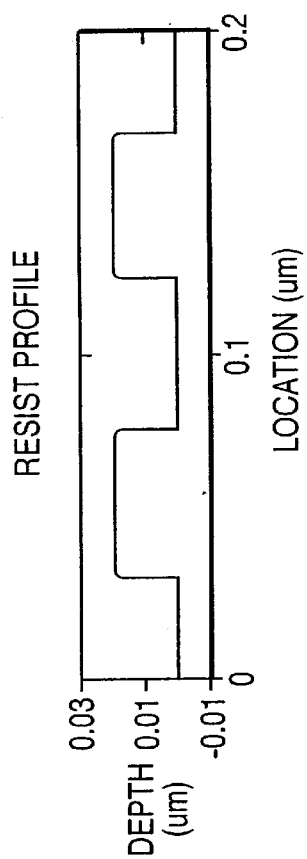
FIG. 7 illustrates an example desired resist profile obtained according to the principles of the present invention.

FIG. 7 illustrates an example desired resist profile obtained according to the principles of the present invention. The resist profile obtained by following the techniques/sequences used to optimizing the resist performance, including, for example, the use of an anti-reflective coating with a refractive index matched to that of the resist layer, the use of thin resist layer, the tuning of the threshold of the development process, the use of post exposure bake (PEB), the use of minimum/maximum development rates of the resist layer, and the subsequent dry-develop process. As shown in FIG. 7, the resist layer reflecting the Talbot sub-images may exhibit a thickness of 20 nm across the length of the wafer 20 from the beginning to the end of each pitch of 200 nm.

Figure 8:
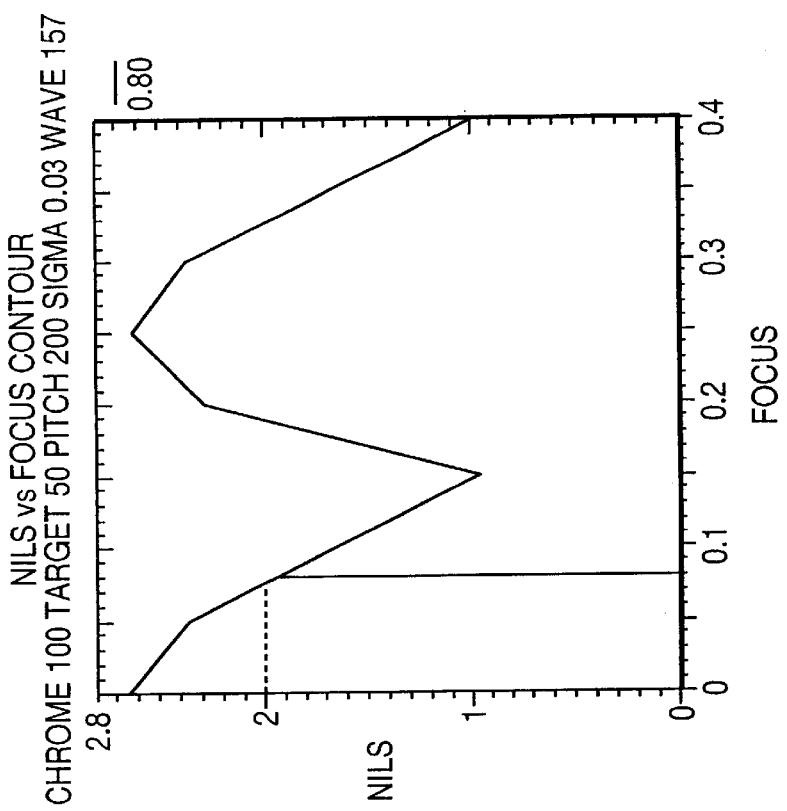
FIG. 8 illustrates an example of a normalized image log-slope metric (NILS) as a function of defocus according to the principles of the present invention.

The resist layer 22 may also require a minimum level of contrast. FIG. 8 illustrates the trend of a normalized image log-slope (NILS) as a function of defocus for existing 157 nm lithography, for example, to use an image pattern with a 100 nm line in a 200 nm pitch shown in FIG. 4 to print a desired image pattern with a 50 nm line in a 100 nm pitch shown in FIG. 2 according to the principles of the present invention. The normalized image log-slope (NELS) may be calibrated with real exposure and focus latitude which in turn yields the minimum NILS required to print in a particular resist for a specified exposure latitude. Since NILS is a measure of the steepness of the aerial image profile at the feature edge, a large value may provide better image patterns. Higher contrast resists permit poorer images to be resolved and allow the process to operate at a lower NILS. As shown in FIG. 8, NILs may peak just below 2.8 and drop to 1 at 150 nm defocus. The depth of focus (DOF) for the process may be determined by the minimum acceptable NILS. If the resists support a minimum acceptable NILS of 2.0, then the desired image pattern as shown in FIG. 4 may be printed with a depth of focus (DOF) of 160 nm (=20.08 $\mu$m).

Figure 9:
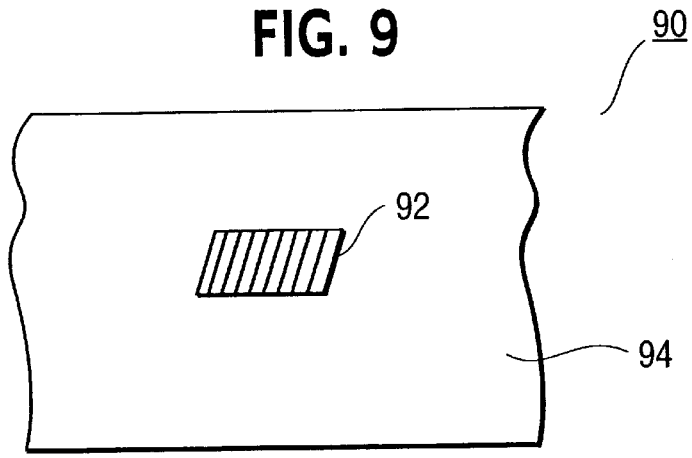
FIG. 9 illustrates an example semiconductor layout having a tight pitch area and a normal pitch area according to the principles of the present invention.

Referring now to FIG. 9, an example semiconductor layout having a tight pitch area and a normal pitch area according to the principles of the present invention is illustrated. As described earlier, image patterns at the tight pitches (ie., tight pitch area 92 of the semiconductor layout 90) are intended by the present invention. As shown in FIG. 9, patterns that are not the tight pitch (i.e., regular pitch area 94 of the semiconductor layout 90) may be protected by use of the standard two mask approach in the critical exposure, and printed by a second exposure using the usual mask.

Figure 10:
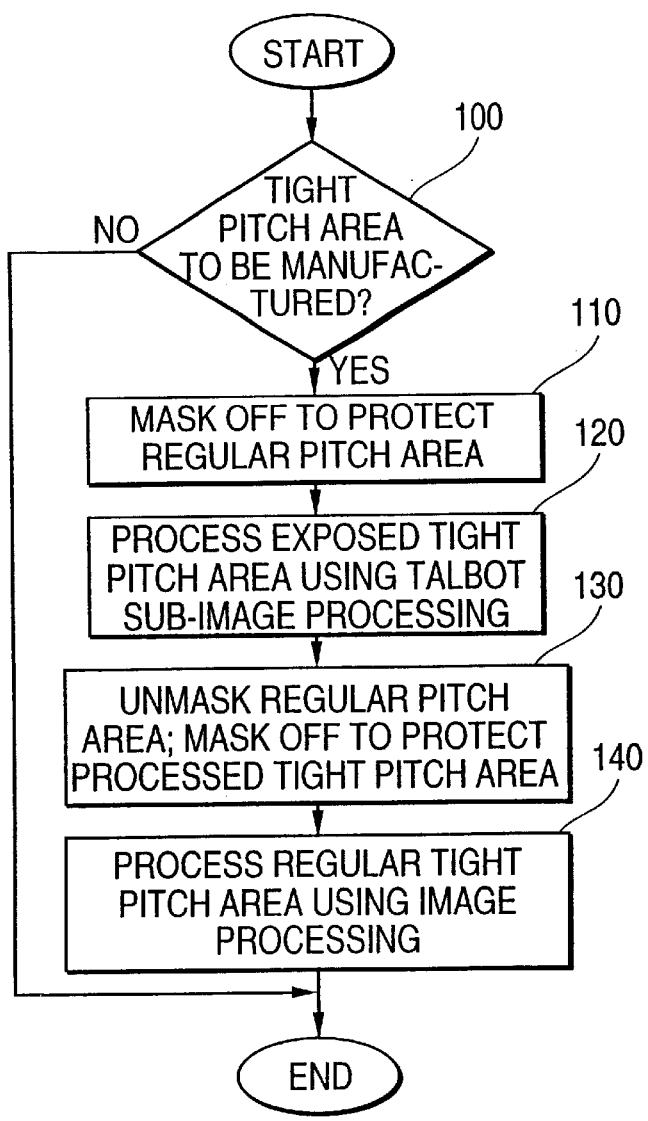
FIG. 10 is an example flowchart diagram of semiconductor manufacture of a semiconductor layout having a tight pitch area and a normal pitch area according to the principles of the present invention.

FIG. 10 is a flowchart diagram of semiconductor manufacture of a semiconductor layout 90 having a tight pitch area 92 and a regular pitch area 94 of the principles of the present invention. First, an inquiry as to whether a tight pitch area 92 needs to be manufactured on the semiconductor layout 90 at block 100. If the tight pitch area 92 needs to be manufactured, a regular pitch area 94 may be masked off for protection against exposure using Talbot sub-image processing according to the present invention at block 110. After the regular pitch area 94 is protected in the critical exposure, the tight pitch area 92 may be formed using the mask pattern as shown, for example, FIG. 4 and using Talbot sub-image processing as described at block 120. After the tight pitch area 92 is formed, the regular pitch area 94 may be unmasked and the tight pitch area 92 may be masked off for protection against exposure using original image processing at block 130. After the tight pitched area 92 is protected in the critical exposure, the regular pitch area 94 may be formed using a regular mask pattern at block 140.

As described in the foregoing, the present invention advantageously utilizes existing optical lithography systems and provides a simple yet effective method for those existing optical lithography systems to advance two generations ahead to print microcircuit patterns in the submicron range that were not previously printable with better feasibility and manufacturing tolerance.

While there have been illustrated and described what are considered to be exemplary embodiments of the present invention, it will be understood by those skilled in the art and as technology develops that various changes and modifications may be made, and equivalents may be substituted for elements thereof without departing from the true scope of the present invention. For example, while the image patterns described with reference to FIGS. 2 and 3 are either a 50 nm line in a 100 nm pitch or a 100 nm line in a 200 nm pitch, and the wavelengths described are either 157 nm or 126 nm, many different wavelengths and pattern dimensions may be available. In addition, the present invention is not limited to light but may also be used with x-ray, etc. Many modifications may be made to adapt the teachings of the present invention to a particular situation without departing from the scope thereof Therefore, it is intended that the present invention not be limited to the various exemplary embodiments disclosed, but that the present invention includes all embodiments falling within the scope of the appended claims.

What is claimed is:

1. A lithography method, comprising the steps of:

utilizing a mask having a mask pattern for printing an image pattern; and forming Talbot sub-images of an illuminated grating on a photosensitive target to print said image pattern on the photosensitive target such that said image pattern printed has a pitch equal to half the pitch of the mask pattern, wherein said Talbot sub-images on the photosensitive target are formed by moving the photosensitive target away from an image plane by a Talbot distance obtained, during exposure of a light beam onto the photosensitive target via said mask, through one of a grating equation of $L^2/2\lambda$ where L represents the pitch of the mask pattern and $\lambda$ represents a wavelength of the light beam selected for optical lithography, and the use of a lithography simulator.

2. The method as claimed in claim 1, wherein said light beam corresponds to a source of partially coherent light having a wavelength selected for optical lithography, and said image pattern corresponds to a nested line-space pattern.

3. The method as claimed in claim 1, further comprising a step of depositing a resist layer on said photosensitive target for forming said image pattern thereon upon exposure of said light beam via said mask.

4. The method as claimed in claim 3, further comprising a step of forming an anti-reflective coating on said photosensitive layer underneath said resist layer with a refractive index matched to that of said resist layer.

5. The method as claimed in claim 3, further comprising a step of optimizing said resist layer by post exposure bake to reduce tilt of resist lines after exposure of said light beam via said mask.

6. The method as claimed in claim 1, further comprising a step of exposing a light beam from a source of partially coherent light having a wavelength selected for optical lithography via said mask to form said image pattern.

7. The method as claimed in claim 1, wherein said mask has a 100 nm line in a pitch of 200 nm, and said image pattern printed has a 50 nm line in a pitch of 100 nm.

8. A method of forming an image, comprising:

forming an image pattern of a first pitch on an image plane of a target by illumination via a mask having a mask pattern of said first pitch; and forming a Talbot image pattern of a second pitch on the target by moving the target away from the image plane of the target by a Talbot distance obtained, during said illumination, through one of a grating equation of $L^2/2\lambda$ where L represents the pitch of the mask pattern and $\lambda$ represents a wavelength of a light beam selected for optical lithography, and the use of a lithography simulator.

9. The method as claimed in claim 8, wherein said step of forming a Talbot image pattern is performed by using said image pattern of said first pitch twice greater than said second pitch.

10. The method as claimed in claim 8, further comprising:

printing said Talbot image pattern of said second pitch on the target after the target is moved away from the image plane of the target by said Talbot distance.

11. The method as claimed in claim 8, further comprising a step of exposing a light source of partially coherent light having a wavelength selected for optical lithography during said illumination to form said Talbot image pattern of said second pitch on the target.

12. The method as claimed in claim 8, further comprising a step of forming a resist layer on the target for forming said Talbot image pattern thereon upon said illumination.

13. The method as claimed in claim 12, further comprising a step of forming an anti-reflective on the target underneath said resist layer with a refractive index matched to that of said resist layer.

14. The method as claimed in claim 12, further comprising a step of optimizing said resist layer by post exposure bake to reduce tilt of resist lines after said illumination.

15. The method as claimed in claim 8, further comprising a step of exposing a light source of partially coherent light having a wavelength selected for optical lithography via said mask to form said image pattern of said first pitch and said Talbot image pattern of said second pitch.

16. The method as claimed in claim 8, wherein said mask pattern has a 100 nm line in a pitch of 200 nm, and said image pattern printed has a 50 nm line in a pitch of 100 nm.

17. A lithography system, comprising:

a radiation source;

a mask having a mask pattern positioned between the radiation source and a target; and means for forming Talbot sub-images of an illuminated grating onto the target to print an image pattern on the target such that said image pattern printed has a pitch equal to half the pitch of the mask pattern, wherein said Talbot sub-images on the target are formed by moving the target away from an image plane by a Talbot distance obtained, during exposure of the radiation source onto the target via said mask, through one of a grating equation of $L^2/2\lambda$ where L represents the pitch of the mask pattern and $\lambda$ represents a wavelength of the radiation source, and the use of a lithography simulator.

18. The system as claimed in claim 17, wherein said radiation source is a source of partially coherent light having a wavelength selected for optical lithography, and said image pattern corresponds to a nested line-space pattern.

19. The system as claimed in claim 17, wherein said target corresponds to a semiconductor substrate having a resist layer deposited for forming said image pattern thereon upon exposure of said radiation source via said mask pattern.

20. The system as claimed in claim 19, wherein said semiconductor substrate includes an anti-reflective coating formed underneath said resist layer with a refractive index matched to that of said resist layer.

21. The system as claimed in claim 20, wherein said resist layer is optimized by post exposure bake to reduce tilt of resist lines.

22. The system as claimed in claim 17, wherein said radiation source is a source of partially coherent light having a wavelength selected for optical lithography.

23. The system as claimed in claim 17, wherein said target is moved away from the image plane of said target by said Talbot distance by a moving mechanism.

24. The system as claimed in claim 17, wherein said mask pattern has a 100 nm line in a pitch of 200 nm, and said image pattern printed has a 50 nm line in a pitch of 100 nm.

25. A lithography system, comprising:

a radiation source;

a mask having a mask pattern positioned between the radiation source and a target; and a moving mechanism which moves the target away from an image plane to form Talbot sub-images of an illuminated grating onto the target by a Talbot distance obtained, during exposure of the radiation source onto the target via said mask, through one of a grating equation of $L^2/2\lambda$ where L represents the pitch of the mask pattern and $\lambda$ represents a wavelength of the radiation source selected for optical lithography, and the use of a lithography simulator, for printing print an image pattern on the target such that said image pattern printed has a pitch equal to half the pitch of the mask pattern.

26. The system as claimed in claim 25, wherein said radiation source is a source of partially coherent light having a wavelength selected for optical lithography, and said image pattern corresponds to a nested line-space pattern.

27. The system as claimed in claim 25, wherein said target corresponds to a semiconductor substrate having a resist layer deposited for forming said image pattern thereon upon exposure of said radiation source via said mask pattern.

28. The system as claimed in claim 27, wherein said semiconductor substrate includes an anti-reflective coating formed underneath said resist layer with a refractive index matched to that of said resist layer.

29. The system as claimed in claim 28, wherein said resist layer is optimized by post exposure bake to reduce tilt of resist lines.

30. The system as claimed in claim 25, wherein said radiation source is a source of partially coherent light having a wavelength selected for optical lithography.

31. The system as claimed in claim 25, wherein said target is moved away from the image plane of said target by said Talbot distance by a moving mechanism.

32. The system as claimed in claim 25, wherein said mask pattern has a 100 nm line in a pitch of 200 nm, and said image pattern printed has a 50 nm line in a pitch of 100 nm.

* * * * *